United States Patent [19]

Kimura et al.

[11] Patent Number: 4,514,857
[45] Date of Patent: Apr. 30, 1985

[54] X-RAY LITHOGRAPHIC SYSTEM

[75] Inventors: Takashi Kimura, Higashimurayama; Kozo Mochiji, Hachioji; Hidehito Obayashi, Nerima, all of Japan

[73] Assignee: Hitachi, Ltd., Tokyo, Japan

[21] Appl. No.: 541,447

[22] Filed: Oct. 13, 1983

[30] Foreign Application Priority Data

Oct. 15, 1982 [JP] Japan .................. 57-179851

[51] Int. Cl.³ .............................. G21K 5/00
[52] U.S. Cl. ...................... 378/034; 378/210
[58] Field of Search .................. 378/34, 35

[56] References Cited

U.S. PATENT DOCUMENTS 4,242,588 12/1980 Silk et al. ................ 378/34

Primary Examiner—Alfred E. Smith
Assistant Examiner—T. N. Grigsby
Attorney, Agent, or Firm—Antonelli, Terry & Wands

[57] ABSTRACT

While a convex mirror is being rotated or rotatingly vibrated about a rotational axis which is parallel to the center axis of the convex mirror and which is eccentric to the convex mirror, a synchrotron radiation flux is caused to be incident on the convex mirror, and a radiation sensitive resist film is irradiated with the reflected radiation flux through a mask.

Thus, an area of uniform irradiation can be increased remarkably as compared with that in a prior art, and the invention is well suited to the irradiation of a semiconductor wafer having a large area.

4 Claims, 7 Drawing Figures

X-RAY LITHOGRAPHIC SYSTEM

BACKGROUND OF THE INVENTION

1. Field of the Invention

The present invention relates to X-ray lithographic systems, and more particularly to an X-ray lithographic system which can transfer a mask pattern of large area uniformly at high precision.

2. Description of the Prior Art

X-ray lithography is a method wherein, as shown in FIG. 1, a mask 2 is irradiated with X-rays 1, and a mask pattern made up of an X-ray transmissive material 3 and an X-ray absorptive material 4 is transferred on a radiation sensitive resist film 5 located behind the mask. Usually the X-rays obtained from the point X-ray source of an electron beam excitation type rotating anode X-ray tube are utilized, but they have the problems that the intensity is low and that the resolution degrades due to penumbra blurring ascribable to a divergent X-ray flux. In contrast, synchrotron radiation is about $10^3$ times higher in intensity than the point X-ray source and exhibits a good collimation. A synchrotron is therefore one of the most hopeful X-ray sources in transferring a pattern in the order of submicrons.

Although the cross section of a synchrotron radiation flux somewhat differs depending upon the scale of the synchrotron, it is in the shape of an ellipse having a minor axis of approximately 20–30 mm and a major axis of approximately 40–60 mm at a position which is about 10 m distant from a synchrotron orbit. Since, however, there is an intensity distribution in a direction perpendicular to the plane of the synchrotron orbit, an area over which a resist film can be exposed to the X-rays effectively uniformly is merely a band-like area having a width of several mm, and a problem is involved in the exposure of a silicon wafer of large diameter.

In order to solve the problem, it is considered that mounting stages for a mask and the wafer are moved relative to the synchrotron radiation, to equivalently scan the surfaces of the mask and wafer with the radiation. In this case, however, such new problems arise that mechanisms for positioning the mask and wafer and mechanisms for moving the mask and wafer mounting stages are individually required, resulting in a complicated system structure, and that the mask and wafer are vibrated by the operations of the moving mechanisms during the exposure, making a precise pattern transfer impossible.

To the end of avoiding the aforementioned problem, there has been proposed a method wherein, as shown in FIG. 2, synchrotron radiation 32 is reflected by a convex mirror 31 so as to enlarge the cross-sectional area of a radiating flux 33 (IBM Research Report, RC8220, 1980). However, the synchrotron radiation is a continuous spectrum as shown in FIG. 3, and according to this method, a wavelength component which has a critical glancing angle smaller than the angle of incidence $\theta_A$ of a flux A to the mirror 31 in FIG. 2 is hardly projected on a specimen surface $S_A$ because the reflection factor becomes a very small value. On the other hand, the angle of incidence $\theta_B$ of a flux B to the mirror is $\theta_B < \theta_A$, and a radiation flux of shorter wavelength is more projected on a specimen surface $S_B$ than on the specimen surface $S_A$. Accordingly, a wavelength distribution arises in the radiation projected on a specimen, and the specimen cannot be uniformly exposed to the radiation.

Further, even in a case where, in the above method employing the convex mirror, the wavelength distribution of the radiation projected on the specimen is reduced by the use of monochromatized radiation, the reflected lights of equal flux widths $\Delta$ in the fluxes A and B are magnified with unequal factors, and the reflection factor has the incidence angle-dependency even within the critical glancing angle, so that the intensity distribution is still involved in the radiation projected on the specimen, and uniform exposure over the whole specimen surface cannot be performed.

SUMMARY OF THE INVENTION

An object of the present invention is to solve the problems stated above, and to provide an X-ray lithographic system which can transfer a mask pattern of large area onto a semiconductor wafer at high precision without ununiform exposure.

In order to accomplish the object, the present invention comprises a radiation cross-sectional area enlarging mechanism including a cylindrical or arcuate convex mirror, and a mechanism for rotating or rotatingly vibrating the convex mirror about a rotational axis which is parallel to the center axis of the convex mirror and which is eccentric thereto.

More specifically, by reflecting incident radiation by means of the convex mirror, the cross-sectional area of a radiant flux is enlarged, and by rotating or rotatingly vibrating the convex mirror about a rotational axis parallel and eccentric to the center axis of the convex mirror, the radiant flux of the enlarged cross-sectional area is vibrated so as to repeatedly scan through a mask a radiation sensitive resist film which is formed on the surface of a wafer to-be-irradiated. Thus, an exposure area is more enlarged, and a radiation density and a wavelength distribution within the reflected radiant flux are substantially reduced.

DETAILED DESCRIPTION OF THE PREFERRED EMBODIMENTS

Embodiment 1

Figure 4:
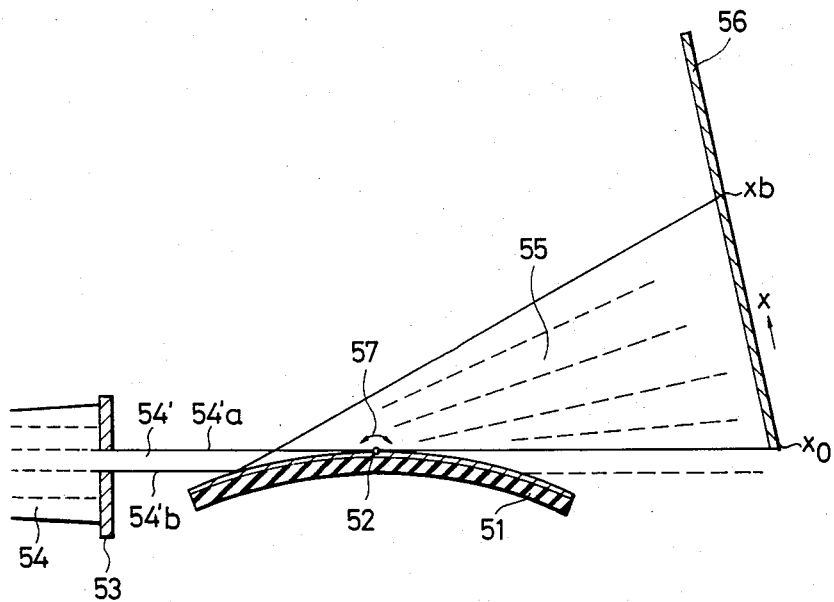
FIG. 4 is a model view for explaining the principle of the present invention.

An example of the present invention will be described with reference to FIG. 4. In the figure, numeral 51 designates an arcuate convex mirror which is used in the present invention. Used as the mirror was such that an Au (gold) layer 30 to 50 nm thick was formed on an arcuate quartz plate having a radius of curvature R=2 m.

Using a slit 53 of a width W=5 mm, that part 54' of synchrotron radiation 54 to which a resist film could be exposed effectively uniformly was selectively passed, and it was caused to incide on the mirror 51 in a stationary state.

The electron acceleration energy E of a synchrotron was 1.0 GeV ($10^9$ eV), the electron polarization flux intensity was M=1 T, and the acceleration current value was I=100 mA.

Figure 5:
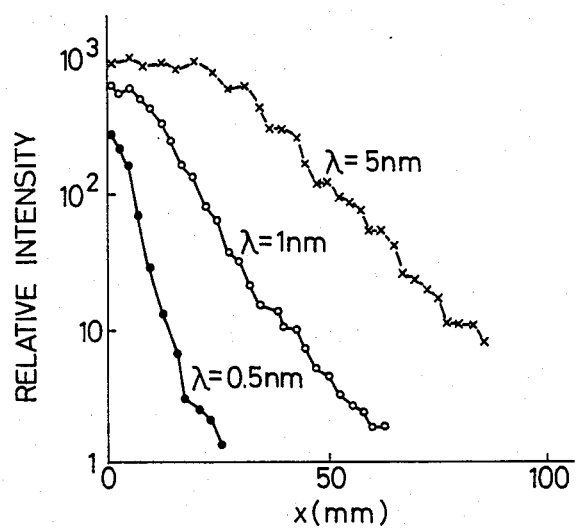
FIG. 5 is a graph showing the intensity distributions of radiant fluxes provided by a prior-art system.

Regarding the angle of incidence of the radiation 54′ to the mirror 51, a mirror position was so set that the upper end part 54′a of the radiation 54′ became a tangential line to the mirror 51. At this time, the angle of incidence of the lower end part 54′b of the radiation 54′ to the mirror 51 was approximately 70 mrad, corresponding to the critical glancing angle $\theta_C$ of a radiation at a wavelength $\lambda = 1$ nm, so that the reflection factor of a radiation of shorter wavelength lowered abruptly. The intensity distribution of the resulting reflected light 55 on a wafer 56 is shown in FIG. 5. The distance from the mirror 51 to the wafer 56 was 1 m.

As seen from FIG. 5, when the convex mirror 51 is stationary, the relative intensities of the reflected radiation 55 at respective wavelengths lower conspicuously with increase in the distance x from the lower end $x_o$ of the wafer 56. Obviously, it is impossible to irradiate the whole surface of the wafer 56 uniformly.

Figure 6:
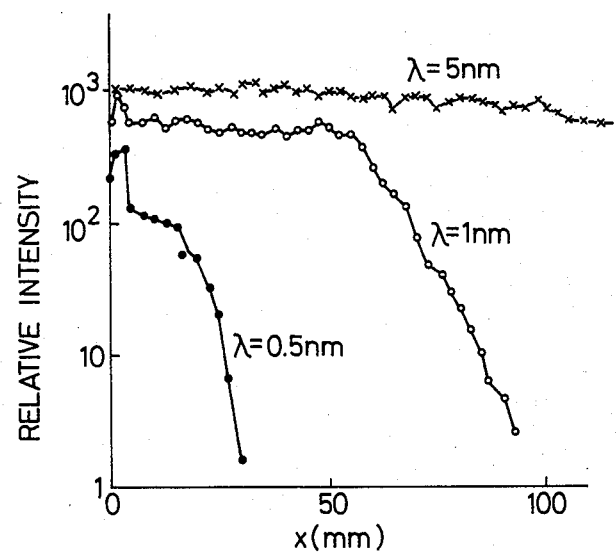
FIGS. 6 and 7 are graphs each showing the effect of the present invention.

On the other hand, FIG. 6 shows a similar intensity distribution obtained when, under the aforementioned conditions, the mirror 51 was rotatingly vibrated at an amplitude of ±100 mrad as indicated by arrows 57 about an axis 52 which lay on the radiant flux 54′a.

As seen from FIG. 6, it has been noted that when the convex mirror 51 is rotatingly vibrated as described above, the range which can be uniformly irradiated with the reflected radiation 55 is remarkably enlarged, and that a range up to about 50 mm can be uniformly irradiated with radiation components having wavelengths $\lambda$ of at least 1 nm.

Since the width W of the incident radiation 54′ is 5 mm as stated above, the irradiation range has been enlarged approximately 10 times by the present invention.

Moreover, as illustrated in FIG. 6, the reflected radiation having a wavelength of 5 nm can irradiate a range of a width of at least 10 cm very uniformly. It is accordingly understood that the present invention is effective for enlarging the area which can be uniformly irradiated.

In a case where the rotational axis of the mirror 51 in the embodiment deviates from the incident flux 54′a, the area in which the uniform exposure intensity is attained decreases. It is therefore favorable to cause both to intersect orthogonally as closely as possible.

Embodiment 2

Figure 7:
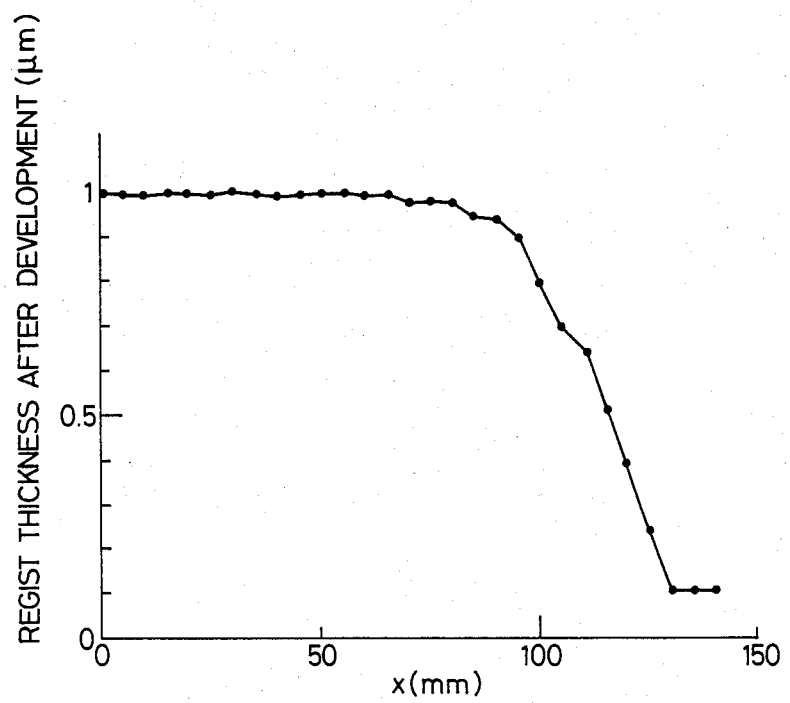

Shown in FIG. 7 is a result obtained when a PMMA (polymethyl methacrylate) resist film having a thickness of 1 μm was irradiated with radiation whose area was enlarged by the reflecting mirror system for the synchrotron radiation used in Embodiment 1, and the distribution of the thickness of the resist film remaining after development, in the direction of magnifying the radiation flux was investigated. It is understood that a range in which a uniform film thickness is attained is about 80 mm wide and is much larger than with the radiation of $\lambda = 1$ nm illustrated in FIG. 6. This is so conjectured that, since the PMMA resist is sensitive over a considerably wide wavelength region, the very high uniformity will have been attained over the wide range by the influence of longer wavelength components contained in the reflected radiation.

While, in the above examples, the convex mirror having the arcuate section was rotatingly vibrated, it may of course be rotated.

Also, when a cylindrical convex mirror is employed and is similarly rotated or rotatingly vibrated, the area of uniform irradiation intensity can be enlarged, and this measure is very useful for the performance of X-ray lithography.

As described above, the present invention consists in that a convex mirror is rotated or rotatingly vibrated, thereby to enhance the uniformity of an irradiation intensity.

The rotation or the rotating vibration is carried out by employing as a rotational axis an axis which is parallel to the center axis of the convex mirror (the center axis of the arcuate or cylindrical convex mirror) and which is eccentric to the concave mirror. Thus, reflected light from the convex mirror is projected on a mask or a resist film as if the former scanned the latter, with the result that a very uniform irradiation intensity distribution is attained over a wide range. Even when the convex mirror is vibrated vertically or in an oblique direction, the uniformity of the irradiation intensity distribution can be enhanced, and the performance is possible.

Since, however, it is often easier to rotate or rotatingly vibrate the convex mirror around a desired rotational axis, the convex mirror is rotated or rotatingly vibrated ordinarily.

According to the present invention, an area which can be uniformly exposed to radiation can be sharply increased, and this is very useful for processing a wafer of large area. The reflection factor of radiation from the convex mirror used in the present invention is, for example, approximately 10% at very short wavelengths of 1–5 nm in a wavelength region effective for X-ray lithography. Since, however, the intensity of synchrotron radiation is approximately 3 orders higher than the intensity of a conventional X-ray source such as a Coolidge tube system, a required exposure time becomes a negligible extent as compared with a time necessary for aligning the mask and the wafer. As a result, the throughput has been remarkably enhanced. Besides, when compared with the foregoing system wherein the exposure area is enlarged by moving the mask and the wafer, the system of the invention can sharply reduce the vibrations of the mask and the wafer. This brings forth the effect that the transfer precision and alignment precision of a pattern in the order of submicrons are enhanced. Vibrations caused by the rotation of the convex mirror can be made less than those in the prior-art system. In addition, a mirror mechanism portion and a mask and wafer aligning mechanism portion can be softly connected by interposing vacuum bellows or the like, so that the vibrations can be lessened more.

Furthermore, since the incidence angle of the radiation can be set at a desired value by properly selecting the radius of curvature or the amplitude of the rotating vibration of the convex mirror, a radiation component of short wavelength which induces the degradation of the characteristics of the wafer to-be-irradiated can be shut off.

Figure 1:
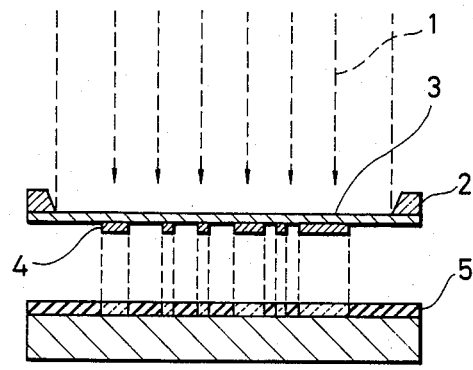
FIG. 1 is a model view for explaining the setup of X-ray lithography.
Figure 2:
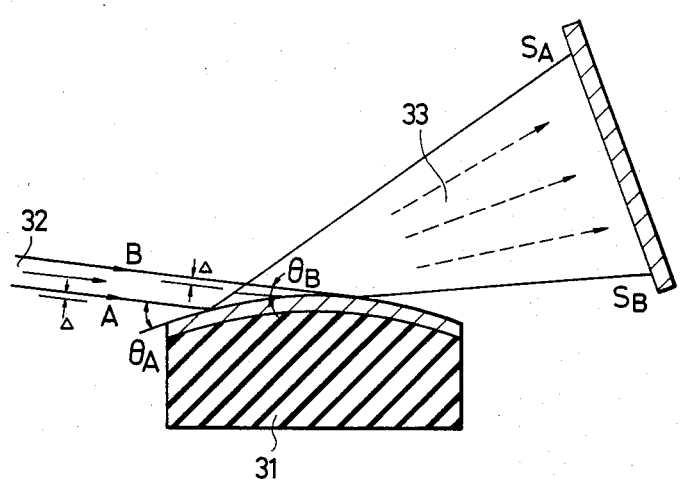
FIG. 2 is a model view showing a method of enlarging a radiant flux with a convex lens.
Figure 3:
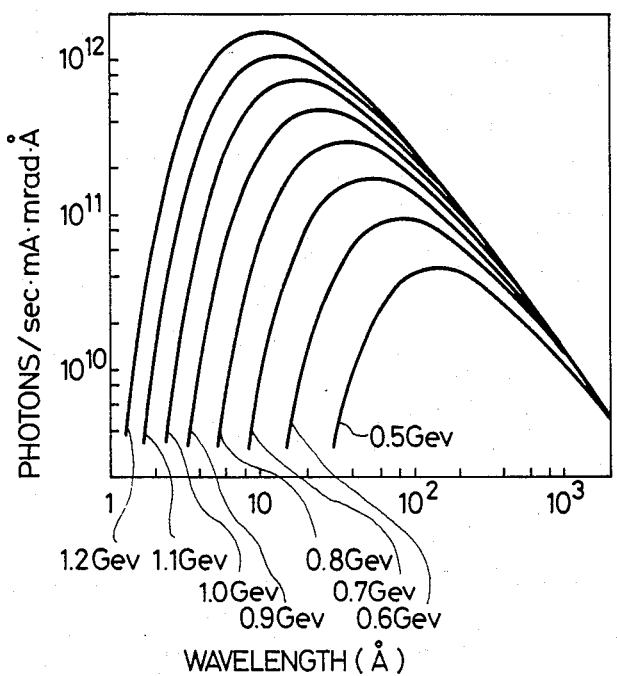
FIG. 3 is a graph showing the wavelength characteristics of electron synchrotron radiation.

In the present invention, the shape of the rear surface of the convex mirror is independent of the functional effects of the invention. It is therefore possible to use, not only the convex mirror of the circular or arcuate section, but also convex mirrors having various sectional shapes, for example, the convex mirror shown in FIG. 2.

The effects of the present invention are not restricted to the case of employing the synchrotron radiation, but the invention is also effective for radiation sources of intense directivity and small flux cross-sectional area, such as the so-called lepton channeling radiation generated by electrons having entered a single crystal ("Ōyo Butsuri"—Applied Physics—, Vol. 49, No. 10, 1980) and a laser beam.

What is claimed is:

1. In an X-ray lithographic system having means to cause a synchrotron radiation flux of desired diameter to be incident on a convex mirror, and means to irradiate a radiation sensitive resist film with reflected light from the convex mirror, through a mask having a desired pattern; an X-ray lithographic system characterized by comprising means to rotate or rotatingly vibrate said convex mirror about a rotational axis which is parallel to a center axis of said convex mirror and which is eccentric to said convex mirror.

2. An X-ray lithographic system according to claim 1, wherein said convex mirror has an arcuate or circular section.

3. An X-ray lithographic system according to claim 2, wherein the rotational axis of said convex mirror intersects substantially orthogonally to an optic axis of the synchrotron radiation flux incident on said convex mirror.

4. An X-ray lithographic system according to claim 3, wherein the rotational axis of said convex mirror lies within the synchrotron radiation flux, and it lies in agreement with or in the vicinity of a side end of the radiation flux located on a reflective surface side of said convex mirror.

* * * * *